United States Patent [19]

Traa

[11] Patent Number: 4,712,087
[45] Date of Patent: Dec. 8, 1987

[54] ANALOG-TO-DIGITAL CONVERTER ERROR CORRECTION CIRCUIT

[75] Inventor: Einar O. Traa, Portland, Oreg.

[73] Assignee: Tektronix, Inc., Beaverton, Oreg.

[21] Appl. No.: 12,752

[22] Filed: Feb. 9, 1987

[51] Int. Cl.[4] .............................................. H03M 1/06
[52] U.S. Cl. ....................... 340/347 CC; 340/347 AD; 371/30
[58] Field of Search ................. 340/347 CC, 347 AD; 371/30

[56] References Cited

U.S. PATENT DOCUMENTS 4,600,916 7/1986 Masuda ........................ 340/347 AD Primary Examiner—Charles D. Miller
Attorney, Agent, or Firm—Paul S. Angello; Robert S. Hulse

[57] ABSTRACT

An error correction circuit (16) corrects errors in the thermometer code ($T_1$-$T_7$) developed by a parallel or "flash" analog-to-digital converter (10). The error correction circuit employs plural similar bit exchange modules (34) of which each includes a 2-input OR gate (46) having common inputs (48 and 50) that constitute the inputs of the bit exchange module. The output (52) of the AND gate and the output (54) of the OR gate constitute the outputs of the bit exchange module. The bit exchange modules receive the digital-to-analog converter thermometer code and are interconnected to correct errors therein resulting from the presence of more than one transition between different logic states for adjacent bits in the thermometer code. The error correction circuit manipulates the thermometer code bits to provide a corrected thermometer code ($T_{1C}$-$T_{7C}$) that has only one transition between different logic states for adjacent bits thereof.

7 Claims, 2 Drawing Figures

ANALOG-TO-DIGITAL CONVERTER ERROR CORRECTION CIRCUIT

TECHNICAL FIELD

The present invention relates to parallel or "flash" analog-to-digital converters and, in particular, to a circuit for detecting and correcting errors in the digital output or "thermometer" code developed by such analog-to-digital converters.

BACKGROUND OF THE INVENTION

A flash analog-to-digital converter typically employs a set of voltage comparator circuits of which each has an analog signal input and a reference signal input. The analog signal inputs receive from a single output of a sample-and-hold circuit a DC voltage representing the amplitude of an analog voltage signal applied to the input of the sample-and-hold circuit and sampled at a particular time. The reference signal input of each comparator receives a different one of DC reference voltages developed by a series-connected resistor network. Each of the comparators provides an output voltage of changing amplitude that represents a first logic state (e.g., logic 1) whenever the sampled analog signal voltage is greater than the DC reference voltage and a second logic state (e.g., logic 0) whenever the sampled analog signal is less than the DC reference voltage.

The outputs of the comparators define collectively the bits of a digital output code. The comparators are arranged in an order such that successive outputs of comparators receiving DC reference voltages of increasing amplitudes represent successive output code bits of increasing order. This arrangement of comparators provides a digital output code, which is sometimes called a "thermometer" code, that nominally has a single transition between bits in the logic 1 state and bits in the logic 0 state. In a nominal thermometer code, the bits in the logic 1 state are of lower orders than those in the logic 0 state. An analog-to-digital converter of "N" binary output bits requires a thermometer code having $2^N-1$ bits and employs, therefore, $2^N-1$ comparators.

The voltage difference between adjacent DC reference voltages developed by the resistor network determines the quantization voltage or "LSB" value of the analog-to-digital converter. For example, an 8-bit analog-to-digital converter that is capable of processing an analog voltage signal with a peak-to-peak maximum swing of two volts has a quantization voltage or "LSB" value of about eight millivolts. Such a relatively small quantization voltage can make the analog-to-digital converter susceptible to errors in the thermometer code. Such errors, which typically result from voltage offsets in and different propagation delay times of the comparators, manifest themselves in a thermometer code that does not have a single transition between bits in the logic 1 state and bits in the logic 0 state. These errors produce an inaccurate thermometer code that provides an analog-to-digital converter output word which misrepresents the amplitude of the analog signal.

SUMMARY OF THE INVENTION

An object of the present invention is, therefore, to provide a flash analog-to-digital converter that develops an output word which accurately represents the amplitude of the analog signal.

Another object of the invention is to provide such an analog-to-digital converter that self-corrects its thermometer code to eliminate therefrom errors which result from differences in comparator offset voltages and propagation delay times.

Additional objects and advantages of the present invention will be apparent from the following detailed description of a preferred embodiment thereof, which proceeds with reference to the accompanying drawings.

DETAILED DESCRIPTION OF PREFERRED EMBODIMENT

Figure 1:
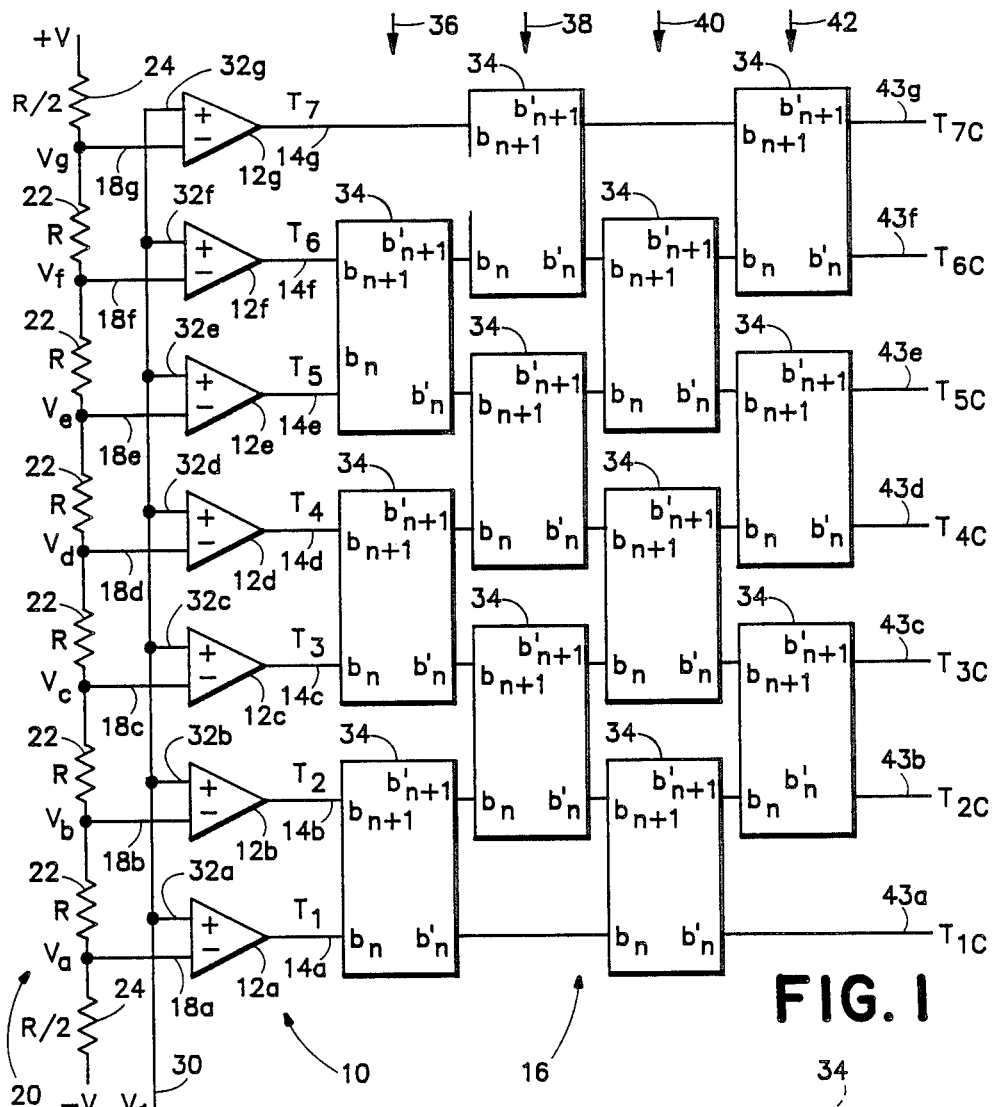
FIG. 1 a simplified diagram of a flash analog-to-digital converter that employs the error correction circuit of the invention.

With reference to FIG. 1, a 3-bit flash analog-to-digital converter 10 of conventional design comprises a set of seven voltage comparators $12a-12g$ on whose respective outputs $14a-14g$ appear voltage signals of changing amplitudes. (A 3-bit digital-to-analog converter is presented for purposes of illustration only. The invention described herein can be practiced with any realizable flash analog-to-digital converter of conventional design.) The voltage signals, which change between two voltage levels to define a digital output or "thermometer" code, are applied to the inputs of error correction circuit 16 of the present invention.

Each comparator $12a-12g$ receives on its respective inverting input $18a-18g$ a DC reference voltage signal provided on a different one of the outputs of a resistor network 20 of conventional design. Resistor network 20 includes eight series-connected resistors, of which six resistors 22 of value "R" are connected between the inverting inputs of adjacent ones of comparators $12a-12g$ and each of two resistors 24 of value "R/2" is connected to a different one of a positive bias voltage, $+V$, and a negative bias voltage, $-V$. The junction nodes of the leads of the six resistors 22 define the outputs of resistor network 20 on which seven DC reference voltages $V_a-V_g$ appear. The reference voltages on adjacent pairs of outputs differ from each other by the quantization value of analog-to-digital converter 10 and increase in amplitude such that $$-V<V_a<V_b<V_c<V_d<V_e<V_f<V_g<+V.$$

Comparators $12a-12g$ are arranged so that the reference voltages and the inverting inputs of comparators to which they are applied have reference numerals with identical lower case letter suffixes. As a consequence, outputs of the comparators identified by reference numeral suffixes of increasing alphabetical order represent thermometer code bits of increasing order. Output $14a$ and output $14g$ represent, therefore, thermometer code bits of the lowest order and the highest order, respectively.

A sample-and-hold circuit 26 receives an analog voltage input signal, $V_A$, of changing amplitude on an input conductor 28. Sample-and-hold circuit 26 samples the input signal $V_A$ at regular time intervals and provides on an output conductor 30 a voltage signal, $V_1$, whose amplitude changes in response to the amplitude of the analog voltage signal $V_A$ at the start of each sampling period. The signal $V_1$ is applied to each of the noninverting inputs 32a–32g of the respective comparators 12a–12g.

Whenever the amplitude of the signal $V_1$ is greater than that of the DC reference signal of any one of the comparators, a voltage representing a first or logic 1 state appears at the output of each such comparator. Whenever the amplitude of the signal $V_1$ is less than that of the DC reference signal of any one of the comparators, a voltage representing a second or logic 0 state appears at the output of each such comparator.

During any one of the sampling periods, the thermometer code has X number of bits in the logic 1 state and Y number of bits in the logic 0 state. If analog-to-digital converter 10 is operating properly, the thermometer code has a "smooth" or single transition between a single group of the X number of bits in the logic 1 state and a single group of the Y number of bits in the logic 0 state, with the bits in the logic 1 state representing the lowest order bits of the thermometer code. In FIG. 1, the bits of the thermometer code are denominated $T_1$–$T_7$, with $T_1$ representing the lowest order bit and $T_7$ representing the highest order bit. In an exemplary case in which $V_d < V_1 < V_e$, the correct thermometer code would be

| $T_1$ | $T_2$ | $T_3$ | $T_4$ | $T_5$ | $T_6$ | $T_7$ |
|---|---|---|---|---|---|---|
| 1 | 1 | 1 | 1 | 0 | 0 | 0. |

In this case, X equals four and Y equals three. The transition between bits in the logic 1 state and the logic 0 state takes place from bit $T_4$ to bit $T_5$. There is an error in the thermometer code whenever there is more than one transition between bits in the logic 1 state and bits in the logic 0 state. As was stated above, this condition can result from voltage offsets in and different propagation delay times of the comparators.

Error correction circuit 16 receives the thermometer code developed by analog-to-digital converter 10 and provides a corrected thermometer code having X+Y number of bits with only one transition between X number of bits in the logic 1 state and Y number of bits in the logic 0 state. In FIG. 1, error correction circuit 16 includes twelve similar bit exchange modules 34 arranged in four columns 36, 38, 40, and 42, each having three bit exchange modules. The highest order of comparator output processed directly or through a bit exchange module in another column determines the order of a bit exchange module in a particular column. The bits of the corrected thermometer code are denominated $T_{1C}$–$T_{7C}$, with $T_{1C}$ representing the lowest order bit and $T_{7C}$ representing the highest order bit. Bit $T_{1C}$ constitutes the $b'_n$ output 43a of the bit exchange module of lowest order in column 40. Bits $T_{2C}$–$T_{7C}$ constitute the respective outputs 43b–43g of the column 42 bit exchange modules.

Figure 2:
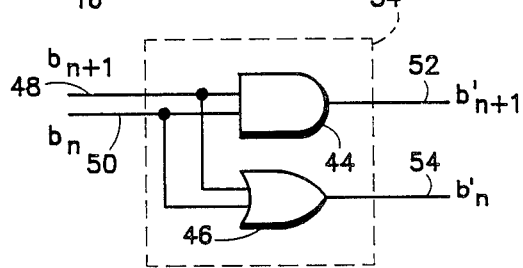
FIG. 2 is a logic circuit diagram of one of twelve similar bit exchange modules incorporated in the circuit of FIG. 1.

With reference to FIG. 2, each of the twelve bit exchange modules 34 includes a 2-input AND gate 44 and a 2-input OR gate 46 that have common inputs 48 and 50, which are denominated $b_{n+1}$ and $b_n$, respectively. AND gate 44 has an output 52, which is denominated $b'_{n+1}$, and OR gate 46 has an output 54, which is denominated $b'_n$. Bit exchange module 34 functions to provide output signals in accordance with the Truth Table 1 set forth below.

| TRUTH TABLE 1 | | | |
|---|---|---|---|
| INPUTS | | OUTPUTS | |
| $b_n$ | $b_{n+1}$ | $b'_n$ | $b'_{n+1}$ |
| 0 | 0 | 0 | 0 |
| 0 | 1 | 1 | 0 |
| 1 | 0 | 1 | 0 |
| 1 | 1 | 1 | 1 |

For each bit exchange module 34 in error correction circuit 16, the $b'_{n+1}$ output is defined to be of higher order than that of the $b'_n$ output.

With reference to FIG. 1, comparators 12a–12g are grouped in three pairs, 12a and 12b, 12c and 12d and 12e and 12f. Comparator 12g does not constitute a part of any comparator pair. The comparators in each of the three pairs represent next adjacent bits of the thermometer code, and none of the comparators is common to any other one of such pairs. Each of the three bit exchange modules 34 in column 36 receives on its $b_{n+1}$ and $b_n$ inputs the outputs of the comparators in the pair to which such bit exchange module is associated. Each of the two bit exchange modules 34 of the lowest orders in column 38 receives on its $b_{n+1}$ and $b_n$ inputs the $b'_{n+1}$ and $b'_n$ outputs from different ones of next adjacent bit exchange modules 34 in column 36, the $b'_{n+1}$ output being provided by the column 36 bit exchange module of lower order. The bit exchange module of highest order in column 38 receives on its $b_{n+1}$ and $b_n$ inputs the output 14g of comparator 12g and the $b'_{n+1}$ output of the bit exchange module of highest order in column 36.

Each of the two bit exchange modules 34 of the highest orders in column 40 receives on its $b_{n+1}$ and $b_n$ inputs the $b'_{n+1}$ and $b'_n$ outputs from different ones of next adjacent bit exchange modules in column 38, the $b'_{n+1}$ output being provided by the column 38 bit exchange module of lower order. The bit exchange module of lowest order in column 40 receives on its $b_{n+1}$ and $b_n$ inputs the $b'_n$ output of the bit exchange module of lowest order in column 36 and the $b'_n$ output of the bit exchange module of lowest order in column 38.

Each of the two bit exchange modules 34 of the lowest orders in column 42 receives on its $b_{n+1}$ and $b_n$ inputs the $b'_{n+1}$ and $b'_n$ outputs from different ones of next adjacent bit exchange modules in column 40, the $b'_{n+1}$ output being provided by the column 40 bit exchange module of lower order. The bit exchange module of highest order in column 42 receives on its $b_{n+1}$ and $b_n$ inputs the $b'_{n+1}$ output of the exchange module of highest order in column 38 and the $b'_{n+1}$ output of the bit exchange module of highest order in column 40. The outputs 43a–43g of error correction circuit 16 provide the corrected thermometer code in a manner that may be explained by way of the following example.

EXAMPLE

This example is directed to the situation in which $V_d < V_l < V_e$, thereby providing a correct thermometer code having bits $T_1$–$T_4$ in the logic 1 state and bits $T_5$–$T_7$ in the logic 0 state, as set forth above. The thermometer code in error for this example includes bits $T_3$, $T_4$, and $T_7$ in the logic 0 state and bits $T_1$, $T_2$, $T_5$, and $T_6$ in the logic 1 state, as set forth below:

| $T_1$ | $T_2$ | $T_3$ | $T_4$ | $T_5$ | $T_6$ | $T_7$ |
|---|---|---|---|---|---|---|

-continued

| | | | | | | |
|---|---|---|---|---|---|---|
| 1 | 1 | 0 | 0 | 1 | 1 | 0. |

There are, therefore, three transitions between logic states, i.e., the transition from bit $T_2$ to bit $T_3$, which defines the lowest order transition, the transition from bit $T_4$ to bit $T_5$, and the transition from bit $T_6$ to bit $T_7$.

The bit exchange process performed by each column of bit exchange modules 34 on the thermometer code in error is summarized in Table II.

TABLE II

| Outputs 14a–14g | Column 36 | Column 38 | Column 40 | Column 42 |
|---|---|---|---|---|
| $T_7 = 0$ | 0 | 0 | 0 | $T_{7C} = 0$ |
| $T_6 = 1$ | 1 | 1 | 0 | $T_{6C} = 0$ |
| $T_5 = 1$ | 1 | 0 | 1 | $T_{5C} = 0$ |
| $T_4 = 0$ | 0 | 1 | 0 | $T_{4C} = 1$ |
| $T_3 = 0$ | 0 | 0 | 1 | $T_{3C} = 1$ |
| $T_2 = 1$ | 1 | 1 | 1 | $T_{2C} = 1$ |
| $T_1 = 1$ | 1 | 1 | 1 | $T_{1C} = 1$ |

Table II shows that the column 36 bit exchange modules cause no change in the thermometer code but that the column 38 bit exchange modules exchange the logic states of bits $T_4$ and $T_5$. The reason is that for a particular bit exchange module, a bit exchange can occur only whenever the logic states of signals applied to the inputs of such bit exchange module are different. The column 40 bit exchange modules exchange the logic states of bits $T_5$ and $T_6$ and the logic states of bits $T_3$ and $T_4$, and the column 42 bit exchange modules exchange the logic states of bits $T_4$ and $T_5$. Column 42 provides the bits $T_{1C}$–$T_{7C}$ in the proper logic states for the corrected thermometer code.

The foregoing example shows that a bit exchange performed by error correction circuit 16 entails the reduction of the order of a thermometer code bit in the logic 1 state. Moreover, error correction circuit 16 functions properly only under circumstances in which the thermometer code in error has bits with the correct number of logic 1 and logic 0 states, i.e., only the order of the logic states is in error.

It will be appreciated that the minimum number of columns of bit exchange modules required to correct the thermometer code depends on the number and the order of bits in the logic 0 state that separate the bits in the logic 1 state. The above example indicates that the orders of thermometer code bits in the same logic state applied to the inputs of the same bit exchange module remain unchanged and that four columns of bit exchange modules are necessary to ensure correction of a thermometer code having two bits in the logic 0 state separating the bits in the logic 1 state.

Only one column of bit exchange modules would be necessary to correct a thermometer code in error having a single bit in the logic 0 state separating the bits in the logic 1 state whenever the bits to be exchanged are applied to the inputs of the same bit exchange module. If the bits to be exchanged are applied not to the inputs of the same bit exchange module but to inputs of adjacent bit exchange modules, two columns of bit exchange modules would be necessary to correct a thermometer code with such an error.

It will be obvious to those having skill in the art that many changes may be made in the above-described details of the preferred embodiment of the present invention without departing from the underlying principles thereof. The scope of the present invention should be determined, therefore, only by the following claims.

I claim:

1. In a flash analog-to-digital converter having plural comparators and a reference circuit with plural DC reference signals of different amplitudes, each of the comparators having an analog signal input, a reference signal input, and a logic signal output, the analog signal inputs receiving an analog signal, each of the reference signal inputs receiving a different one of the DC reference signals, and the output signal of each comparator defining one bit of a digital thermometer code which bit is in a first logic state whenever the amplitude of the analog signal is greater than that of the DC reference signal and is in a second logic state whenever the amplitude of the analog signal is less than that of the DC reference signal, a method of determining the presence of and correcting errors in the thermometer code, comprising:

arranging the comparator outputs in an order that defines a digital thermometer code in which the outputs of comparators receiving DC reference signals of increasing amplitudes represent thermometer code bits of increasing order, the thermometer code having X number of bits in the first logic state and Y number of bits in the second logic state in response to the amplitude of the analog signal;

determining whether there is more than one transition between the first and second logic states for adjacent bits in the thermometer code, the transition for adjacent bits of lowest order defining a lowest order transition; and upon detection of transitions other than the lowest order transition, providing a corrected digital thermometer code having X number of bits in the first logic state and Y number of bits in the second logic state but having only one transition between the first and second logic states.

2. The method of claim 1 further comprising decreasing as many times as necessary the orders of bits that are in the first logic state and are of orders higher than those of the bits defining the lowest order transition.

3. In a flash analog-to-digital converter having plural comparators and a reference circuit with plural DC reference signals of different amplitudes, each of the comparators having an analog signal input, a reference signal input, and a logic signal output, the analog signal inputs receiving an analog signal, each of the reference signal inputs receiving a different one of the DC reference signals, and the output signal of each comparator defining one bit of a digital thermometer code which bit is in a first logic state whenever the amplitude of the analog signal is greater than that of the DC reference signal and is in a second logic state whenever the amplitude of the analog signal is less than that of the DC reference signal, a method of determining the presence of and correcting errors in the thermometer code, comprising:

arranging the comparator outputs in an order that defines a digital thermometer code in which the outputs of comparators receiving DC reference signals of increasing amplitudes represent thermometer code bits of increasing order;

grouping adjacent ones of the comparator outputs in pairs, each pair including no comparator output that is grouped in any of the other pairs; and applying each pair of comparator outputs to different inputs of an AND gate and to different inputs of an OR gate, the AND gate and the OR gate outputs defining respective higher order and lower order outputs of the pair, thereby to correct in the thermometer code errors arising from the presence of plural transitions between logic states for adjacent bits in the thermometer code by providing for each pair of comparator outputs a signal in the second logic state on the higher order output and a signal in the first logic state on the lower order output whenever the inputs of the AND and OR gates receive one bit in the first logic state and one bit in the second logic state.

4. In a flash analog-to-digital converter having plural comparators and a reference circuit with plural DC reference signals of different amplitudes, each of the comparators having an analog signal input, a reference signal input, and a logic signal output, the analog signal inputs receiving an analog signal, each of the reference signal inputs receiving a different one of the DC reference signals, and the output signal of each comparator defining one bit of a digital thermometer code which bit is in a first logic state whenever the amplitude of the analog signal is greater than that of the DC reference signal and is in a second logic state whenever the amplitude of the analog signal is less than that of the DC reference signal, the improvement comprising:

means for arranging the comparator outputs in an order that defines a digital thermometer code in which the outputs of the comparators receiving DC reference signals of increasing amplitudes represent thermometer code bits of increasing order, a transition between the first and second logic states for adjacent bits of lowest order in the thermometer code defining a lowest order transition; and correcting means receiving the thermometer code for decreasing the order of the bits in the first logic state and of an order greater than those of the bits defining the lowest order transition to develop a corrected thermometer code having only one transition between first and second logic states for adjacent bits thereof.

5. The analog-to-digital converter of claim 4 in which the correcting means provides a corrected thermometer code of the same number of bits in the first logic state as that of the thermometer code.

6. The analog-to-digital converter of claim 4 in which adjacent ones of the comparators define a comparator of higher order and a comparator of lower order, and the correcting means comprises plural bit exchange modules of which each one has two inputs, a higher order output, and a lower order output, each of the two inputs receiving a signal from a different logic signal output of adjacent ones of the comparators so that whenever the signals provided by the logic signal outputs of the higher order and the lower order comparators are in, respectively, the first logic state and the second logic state, the higher order and the lower order bit exchange module outputs are in, respectively, the second logic state and the first logic state, thereby to reduce the order of the signal developed on the logic signal output of the higher order comparator.

7. The analog-to-digital converter of claim 6 in which each one of the bit exchange modules comprises an AND gate and an OR gate, the AND gate and the OR gate having two different common inputs that define the two inputs of the bit exchange module and having two outputs defining the respective higher and lower order outputs of the bit exchange module.

* * * * *